United States Patent
Delaille et al.

(10) Patent No.: US 8,106,632 B2
(45) Date of Patent: Jan. 31, 2012

(54) METHOD FOR MANAGING A BANK OF RECHARGEABLE BATTERIES USING THE COUP DE FOUET EFFECT ON CHARGING

(75) Inventors: Arnaud Delaille, Bassens (FR); Marion Perrin, Mery (FR)

(73) Assignee: Commissariat a l'Energie Atomique, Paris (FR)

( * ) Notice: Subject to any disclaimer, the term of this patent is extended or adjusted under 35 U.S.C. 154(b) by 593 days.

(21) Appl. No.: 12/226,543

(22) PCT Filed: May 11, 2007

(86) PCT No.: PCT/FR2007/000800
§ 371 (c)(1),
(2), (4) Date: Oct. 21, 2008

(87) PCT Pub. No.: WO2007/132086
PCT Pub. Date: Nov. 22, 2007

(65) Prior Publication Data
US 2009/0072788 A1    Mar. 19, 2009

(30) Foreign Application Priority Data
May 11, 2006    (FR) .................... 06 04193

(51) Int. Cl.
*H02J 7/00* (2006.01)
*H02J 7/04* (2006.01)
*H02J 7/16* (2006.01)
*H02J 7/06* (2006.01)
*H02J 7/24* (2006.01)

(52) U.S. Cl. ........ 320/137; 320/132; 320/152; 320/157; 320/159; 320/164

(58) Field of Classification Search ............ 320/137
See application file for complete search history.

(56) References Cited

U.S. PATENT DOCUMENTS

| | | | |
|---|---|---|---|
| 4,767,977 A | 8/1988 | Fasen et al. | |
| 4,849,682 A | 7/1989 | Bauer et al. | |
| 5,057,762 A * | 10/1991 | Goedken et al. | 320/116 |
| 5,539,297 A | 7/1996 | Fiebig | |
| 5,554,920 A | 9/1996 | Kokuga | |

(Continued)

FOREIGN PATENT DOCUMENTS

EP    0 314 155 A2    5/1989

(Continued)

OTHER PUBLICATIONS

Anbuky et al., "Knowledge Based VRLA Battery Monitoring and Health Assessment," *Telecommunications Energy Conference, IEEE*, Sep. 10, 2000, pp. 687-694.

(Continued)

*Primary Examiner* — Edward Tso
*Assistant Examiner* — Ahmed Omar
(74) *Attorney, Agent, or Firm* — Oliff & Berridge, PLC

(57) ABSTRACT

The batteries of at least one battery subset are partially and preferably simultaneously charged; during this partial charging, electrical parameters representative of a coup de fouet effect on charging are measured to enable the extent of discharge of each of the batteries of the subset to be analyzed; the batteries are then charged sequentially with an order of priority that depends on the extent of discharge of the different batteries; priority is preferably given to charging the most extensively discharged batteries.

9 Claims, 7 Drawing Sheets

U.S. PATENT DOCUMENTS

| | | | |
|---|---|---|---|
| 5,627,452 A | 5/1997 | Okada | |
| 5,818,202 A | 10/1998 | Miyamoto et al. | |
| 5,977,750 A | 11/1999 | Ng et al. | |
| 6,137,292 A * | 10/2000 | Hirsch et al. | 324/427 |
| 6,255,801 B1 | 7/2001 | Chalasani | |
| 6,489,743 B1 | 12/2002 | Alzieu et al. | |
| 6,924,622 B1 | 8/2005 | Anbuky et al. | |
| 7,663,344 B2 * | 2/2010 | Le Gall et al. | 320/136 |
| 2007/0222418 A1 | 9/2007 | Le Gall et al. | |

FOREIGN PATENT DOCUMENTS

| | | |
|---|---|---|
| JP | A-2000-278872 | 10/2000 |
| WO | WO 00/75678 A1 | 12/2000 |
| WO | WO 03/047064 A2 | 6/2003 |
| WO | WO 2006/003287 A1 | 1/2006 |

OTHER PUBLICATIONS

Bose et al., "Battery State of Health Estimation Through Coup De Fouet," *Telecommunications Energy Conference, IEEE*, Sep. 10, 2000, pp. 597-601.

Pascoe et al., "Estimation of VRLA Battery Capacity Using The Analysis of The Group De Fouet Region," *Telecommunications Energy Conference, IEEE*, Jun. 6, 1999.

* cited by examiner

METHOD FOR MANAGING A BANK OF RECHARGEABLE BATTERIES USING THE COUP DE FOUET EFFECT ON CHARGING

BACKGROUND OF THE INVENTION

The invention relates to a method for managing a bank of rechargeable batteries comprising a sequential charging cycle of the batteries of the bank according to an order of priority and analysis of the state of charge of the batteries.

STATE OF THE ART

Numerous installations comprise a set of rechargeable batteries constituting a battery bank. Management of a battery is however generally performed by monitoring the voltage at its terminals, discharging of the battery being for example interrupted at a low voltage threshold and charging thereof being interrupted at a high voltage threshold. A battery that has reached one of these two limit voltages is generally disconnected in order to protect it respectively from overcharging or from extensive discharging which would be liable to damage the battery irreversibly. Although this type of management has the advantage of being simple to implement, setting up an improved method of management of a battery bank can ensure satisfactory operation of the system and optimize the service time of each battery of the bank and the cost and service rendered to the user.

The batteries of a battery bank are however generally recharged simultaneously or successively so as to keep them permanently charged. Intelligent management of the charge of each battery, designed to optimize the performances of the whole of the bank, in particular requires the state of charge (SOC) of each of the batteries to be taken into account.

Furthermore, although it is fully charged, a battery presents a decrease of its capacity with time. This decrease is a function of the conditions of use of the battery and its extent is generally difficult to evaluate without measuring the capacity. In numerous applications, in particular in the telecommunications field, a battery is considered to be defective and having to be replaced when its capacity drops below 80% of its nominal or initial capacity. Intelligent management of a bank of batteries therefore also requires the state of health (SOH) of each of the batteries to be taken into consideration.

In document EP-A-314155, priority is given to the most charged battery so as to rapidly provide a fully charged battery. The level of charge of the batteries is determined by measuring the voltage of the batteries at rest. After sequential charging of all the batteries during preset times, the priority criteria are reviewed if necessary, in particular when a battery is added or removed from the charger or when the priority battery has completed its charge cycle. The end of the charge cycle is determined by the charging time, the temperature and/or the voltage of the charged battery.

U.S. Pat. No. 5,057,762 also describes determination of the state of charge of batteries to be charged by a same charger to define a priority sequence for sequential charging of these batteries. The state of charge of a battery is determined by measuring the voltage at the terminals of this battery on charge during a given period (2 mn for 2 batteries). During this period, the batteries are successively charged with a high current called fast charge current, whereas the other batteries are charged with a weak current called slow charge current. At the end of this period, the state of charge of the batteries is compared and, as before, priority is assigned to the battery with the highest charge level to charge one of the batteries as quickly as possible. Management of a battery bank consisting in priority charging of the most charged batteries, as in the above-mentioned two patents, does however inevitably lead to intensive use of certain batteries of the bank in high states of charge and intensive use of the other batteries in weak states of charge. This type of management therefore results in inhomogeneous aging of the battery bank, which goes against optimization of its operation. For example, in the case of lead-acid batteries, the batteries used intensively in weak states of charge are subject to a type of degradation called hard sulphidation, that is very difficult to reverse, resulting in the formation of lead sulphide crystals and a loss of capacity. The batteries used intensively at high states of charge are for their part subject to loss of water contained in the electrolyte by electrolysis, and to corrosion of the positive electrode current collector again leading to a loss of capacity.

Document WO-A-00/75678 and U.S. Pat. No. 6,255,801 further describe methods for determining the capacity and/or age of a battery according to electrical parameters, peak voltage and plateau voltage, representative of a coup de fouet effect occurring at the beginning of discharging of a battery when the latter is fully charged. These different methods enable it to be determined whether a battery has to be replaced without having to fully discharge the latter.

U.S. Pat. No. 6,489,743 describes a method for management of an electric power production unit, more particularly a unit comprising batteries connected to photovoltaic modules. A regulator controls charging of the batteries so as to charge them successively to the maximum, taking account of their state of charge, when the solar energy source is available. Control of the state of charge of the batteries is based on the quantity of ampere-hours input to each of the batteries.

Document WO-A-2006/003287 describes a method for establishing a charging priority criterion according to the state of health of the batteries. Diagnosis of the state of health of the batteries is determined from electrical parameters representative of a coup de fouet effect on discharging, an effect observed at the beginning of discharging of a fully charged battery. This method enables the batteries considered to be in a bad state following this diagnosis to be recharged more frequently, or can even recommend that they be replaced.

OBJECT OF THE INVENTION

The object of the invention is to provide a method for management of a bank of rechargeable batteries not presenting the shortcomings of known systems and, more particularly, a method enabling management of the bank of batteries to be optimized.

According to the invention, this object is achieved by a method according to the appended claims.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

The management method according to the invention can be implemented in a control device by any suitable means, and more particularly by means of a microprocessor in which the different steps of the management method are programmed.

Figure 1:
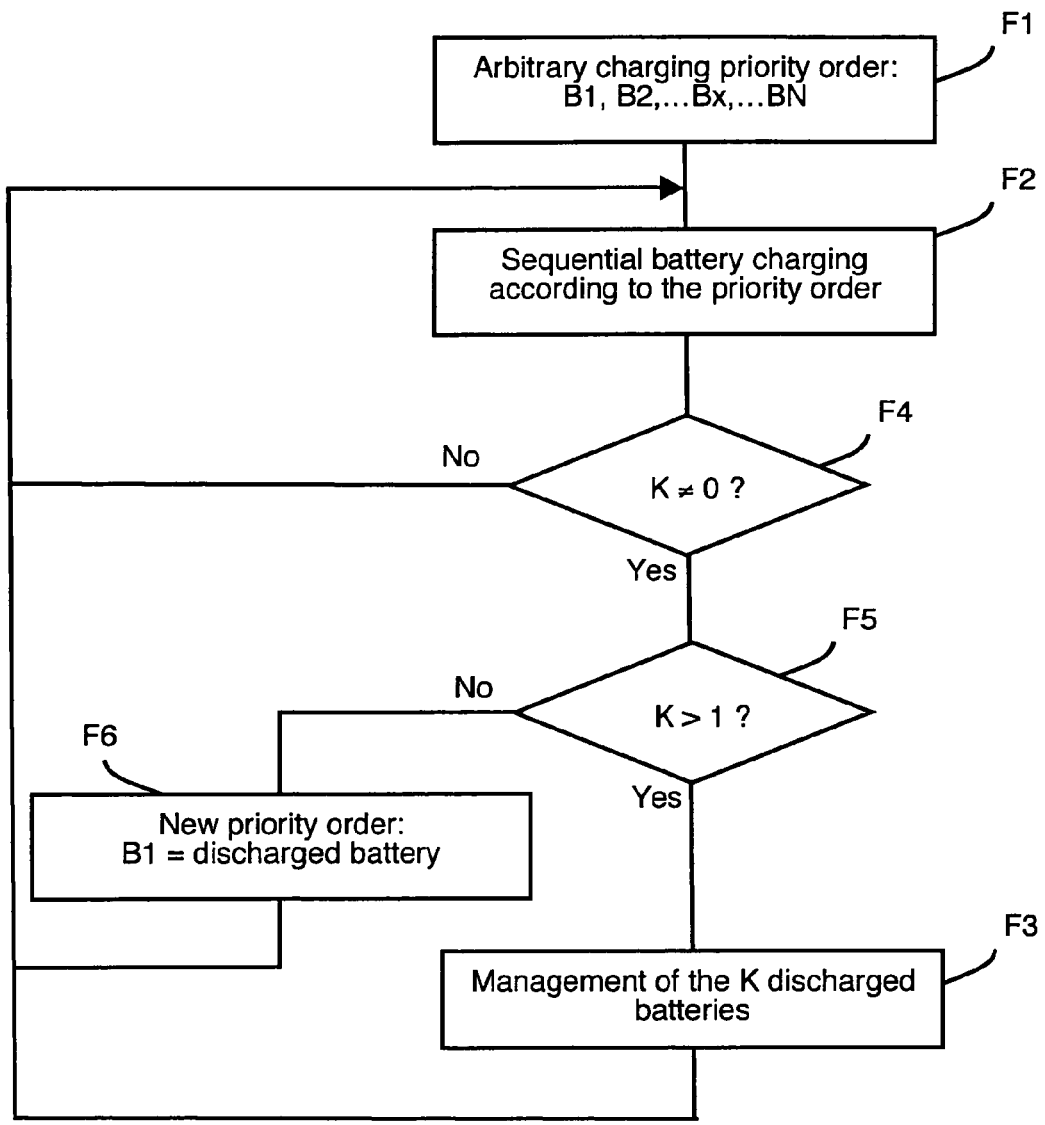
FIGS. 1 to 4 illustrate a particular embodiment of a management method according to the invention in flowchart form.

In the particular embodiment represented in FIG. 1, initially, when all the batteries of a bank are brand-new, an arbitrary charging priority order is fixed and stored in the control device (step F1). Thus, for a bank of N batteries, B1 being assigned to the 1$^{st}$ battery to be charged, B2 to the next one, and so on up to BN for the last battery, the N batteries of the bank are then charged sequentially in this order of priority, from B1 to BN (step F2).

Advantageously, during the sequential charging cycle the control device checks, in known manner, whether the batteries have reached a preset discharge level, i.e. whether they have reached a preset end of discharge criterion, for example a preset low voltage threshold. When a battery is fully discharged, it is preferably at least temporarily disconnected from the discharging system, i.e. it is no longer authorized to discharge. It can on the other hand still undergo full charging if its turn for charging occurs subsequently in the course of the current sequential charging cycle. The corresponding information, in particular the number K of fully discharged batteries and their identity, is then stored. If at the end of the current sequential charging cycle, several batteries are fully discharged, the control circuit goes on to a step (F3) of management of the K fully discharged batteries before reverting to a new sequential charging step.

In the particular embodiment illustrated in FIG. 1, at the end of a sequential charging cycle of the batteries, the control circuit first checks (F4) whether at least one battery is fully discharged (K≠0 ?). If this is not the case (No output of F4), the control circuit loops back to step F2 and runs a new sequential charging cycle of the batteries, without having modified the order of priority. The control circuit can, in a preferred alternative embodiment, loop back to step F1 which can fix a new arbitrary priority order.

If at the end of a sequential charging cycle at least one battery is fully discharged (Yes output of F4), the control circuit checks (F5) whether more than one battery is fully discharged (K>1 ?). If this is not the case (No output of F5), this means that a single battery is fully discharged. The control circuit then modifies the order of priority (F6) so that the single fully discharged battery is charged first (B1=discharged battery) in the next sequential charging cycle. After it has modified the order of priority in step F6, the control circuit loops back to step F2 and runs a new sequential battery charging cycle taking the new order of priority into account, i.e. first recharging the fully discharged battery.

If several batteries are fully discharged at the end of a sequential charging cycle (Yes output of F5), the control circuit goes on to step F3 of management of the K discharged batteries before returning to a new sequential charging step. The latter then takes account of a new order of priority if one has been established at the outcome of this process, described in greater detail below with reference to FIG. 2.

Figure 2:
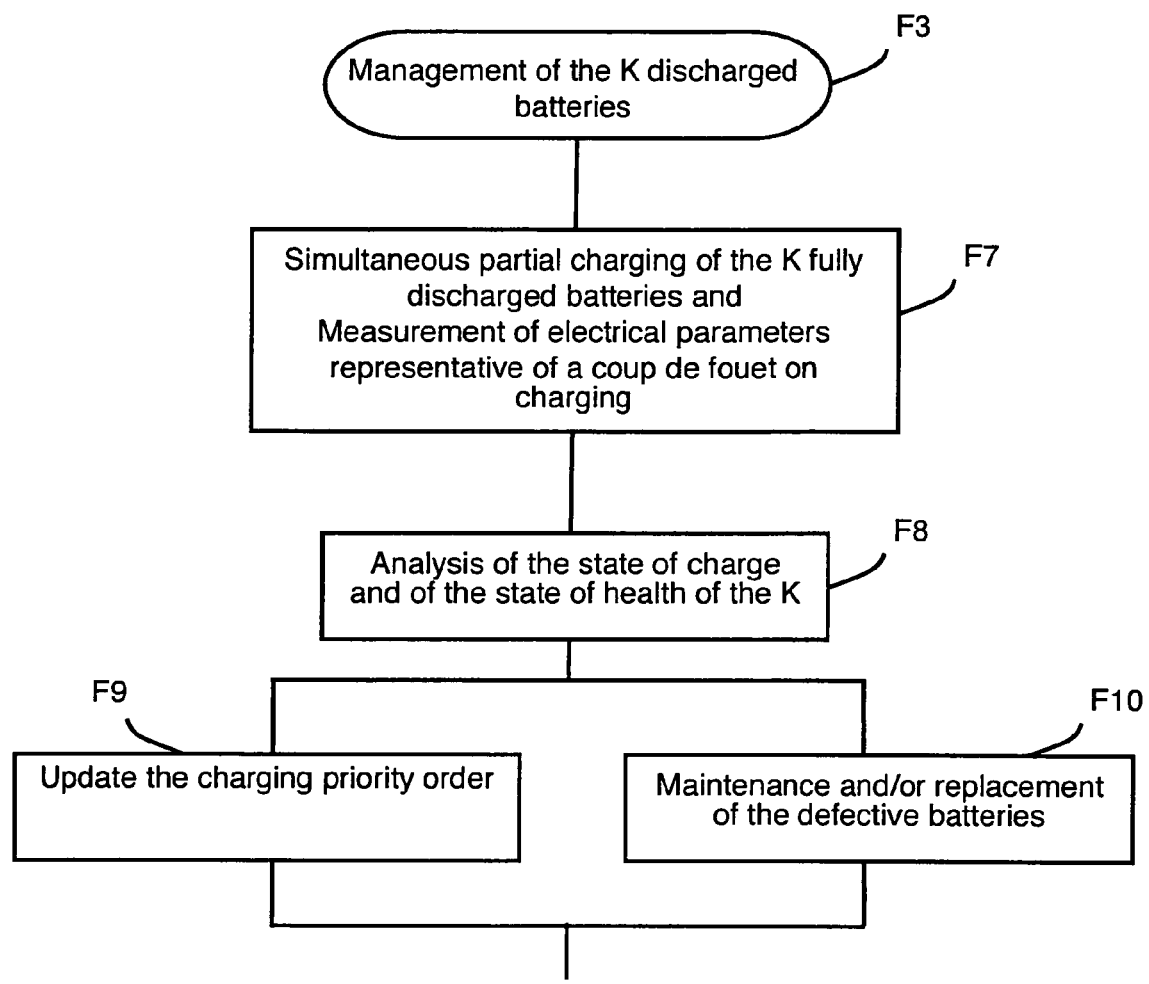

In the particular embodiment of FIG. 2, management of the K discharged batteries begins, in a step F7, with simultaneous partial charging of all the fully discharged batteries, preferably during a preset period of time, for example during one hour. During this simultaneous partial charging, electrical parameters representative of a coup de fouet effect on charging are measured for each of the recharged batteries. These measurements are then used by the control circuit to analyze the state of charge and the state of health of these K batteries in a step F8.

Simultaneous charging of the fully discharged batteries during step F7 ensures that these batteries are charged under similar conditions, for example as regards the current and/or the temperature, thereby ensuring dependability of the diagnosis established when analysis of their state of charge and/or health is performed during the step F8. The charging conditions then do not need to be controlled to ensure dependable diagnosis of the state of the batteries.

The state of charge of these K batteries is then used to update the charging order of priority, in a step F9, that will be used in the next sequential charging cycle (F2). In a preferred embodiment, analysis of the state of charge of the batteries comprises comparison of the depth of discharge of the different simultaneously recharged batteries. This depth of discharge is more particularly representative of the state of the material of the fully discharged batteries. The order of priority is then preferably modified (F9) so that priority is assigned to charging the most deeply discharged batteries at the next sequential charging cycle.

Analysis of the state of health of the batteries partially and simultaneously recharged during step F7 among other things enables the defective batteries to be detected. This state of health can be used, in a step F10, to trigger maintenance and/or replacement actions of the defective batteries. For example, a maintenance action of step F10 may consist in adjusting the charging strategy according to the state of health of each battery.

Although in FIG. 2 steps F9 and F10 are performed in parallel, they may if required be performed successively.

Figure 3:
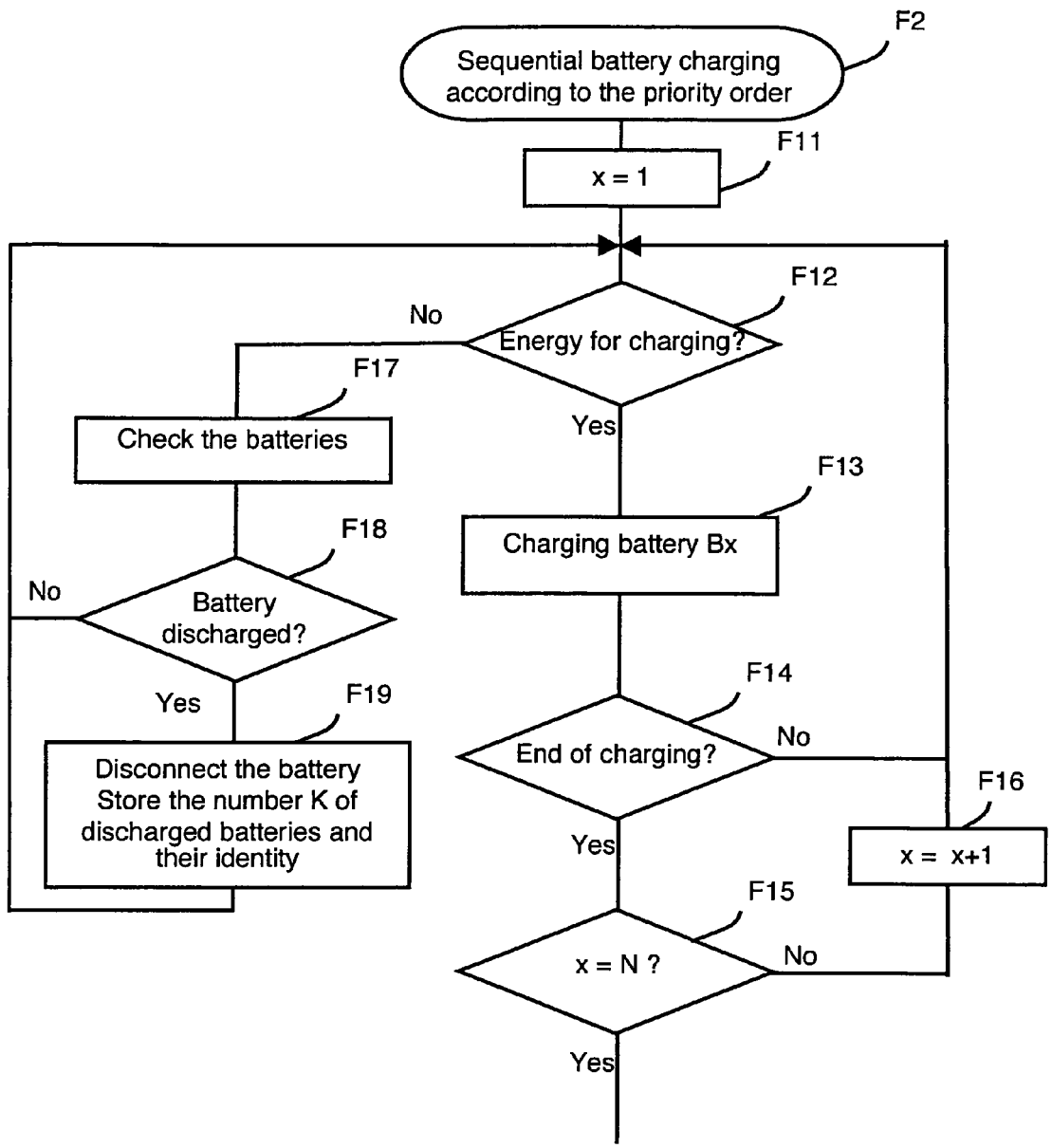

FIG. 3 illustrates a particular example embodiment of step F2 of sequential charge of the batteries according to the order of priority in force (from B1 to BN) in greater detail in flowchart form. This example applies in particular in installations in which energy is not necessarily permanently available for charging the battery bank, for example in the case of a photovoltaic installation or a hybrid photovoltaic installation with a diesel generator.

In FIG. 3, sequential charging begins, in a step F11, by initially setting an index x to 1, enabling the order of priority in force to be taken into account. Then in a step F12, the control circuit checks the availability of charging energy. If this energy is available (Yes output of F12), charging of battery Bx begins (F13). The control circuit periodically checks (F14) whether charging of battery Bx is terminated, i.e. whether a preset end of charging criterion has been reached. If this is not the case (No output of F14), it loops back to step F12 to check the availability of charging energy. When charging of battery Bx is terminated (Yes output of F14), the control circuit checks in a step F15 whether all the batteries of the bank have been fully charged sequentially (x=N ?). If this is not the case (No output of F15), the sequential charging cycle is not terminated, the index x is incremented in a step F16 (x=x+1) and the control circuit returns to step F12 to charge the next battery, according to the order of priority in force at the beginning of the sequential charging cycle.

In the particular embodiment of FIG. 3, when the charging energy is no longer available (No output of F12) in the course of the sequential charging cycle, the control circuit performs checking of the discharging batteries in a step F17 to detect whether certain batteries are fully discharged. If none of the batteries is fully discharged (No output of F18), the control circuit loops back to step F12 to resume the current charging when the charging energy becomes available again (Yes output of F12). If on the other hand at least one of the batteries is discharged (Yes output of F18), the control circuit disconnects it from the discharging system, only authorizing it to undergo full charging if its turn arises in the current sequential charging cycle. The control circuit stores the number K of fully discharged batteries and their identity before looping back to step F12.

Thus, at the end of sequential charging step F2, all the batteries of the bank have been successively charged according to the order of priority in force at the beginning of this sequential charging cycle, using the charging energy available in the installation. Moreover, the control circuit has placed the fully discharged batteries on standby and stored their number K and their identity so as to then enable management of the discharged batteries (F3) and modification of the order of priority for the next sequential charging cycle if necessary.

Monitoring of the batteries can be performed either permanently or periodically, in parallel with sequential charging of the batteries or systematically at the end of each sequential charging step, when the batteries are all discharging.

As indicated above with reference to FIG. 2, the electrical parameters measured during step F7 and used (F8) for analyzing the state of charge and/or of health of the K fully discharged batteries are parameters representative of a coup de fouet effect on charging.

Figure 5:
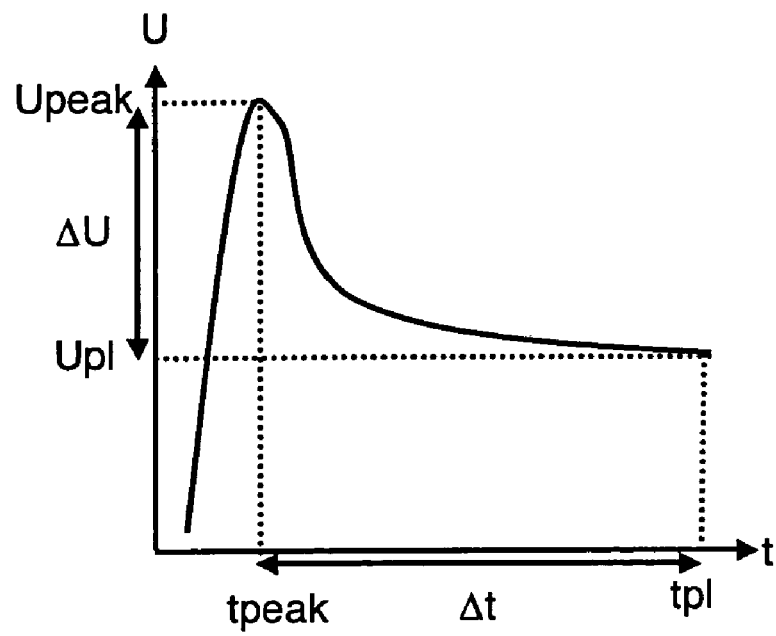
FIG. 5 represents the variations of the voltage U at the terminals of a fully discharged battery versus time when partial charging is performed.

As illustrated in FIG. 5 which represents the variations versus time t of the voltage U at the terminals of a fully discharged battery during partial charging, a coup de fouet effect on charging is observable at the beginning of charging of a previously sufficiently discharged battery. The coup de fouet on charging is characterized by a voltage peak at the battery terminals in a first phase of charging of a sufficiently discharged battery before the voltage drops off to a plateau during the following phase. The coup de fouet can for example be characterized by the peak voltage Upeak, the plateau voltage Upl, the difference $\Delta U = Upeak - Upl$ between peak voltage and plateau voltage, the peak time tpeak required to reach peak voltage Upeak since beginning of charging, the plateau time tpl necessary to reach plateau voltage Upl, and/or the difference $\Delta t = tpl - tpeak$ between the plateau time and peak time.

Figure 6:
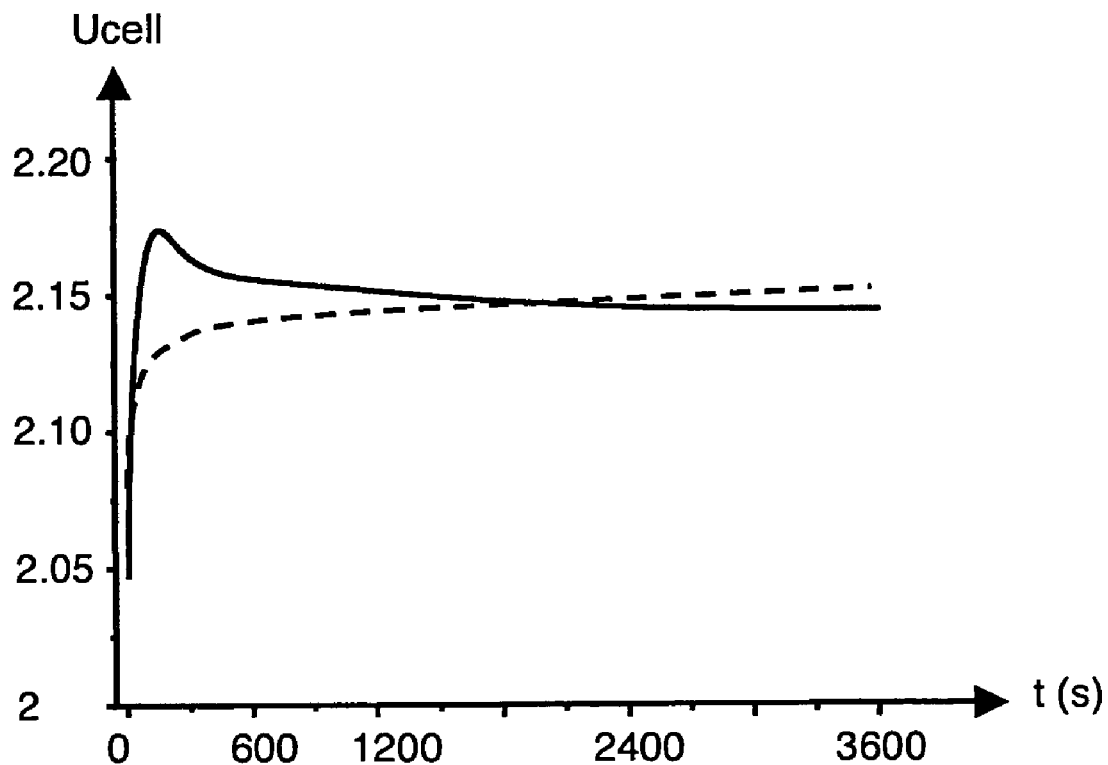
FIG. 6 represents the variations of the voltage Ucell at the terminals of a battery cell versus time when partial charging is performed, respectively after full discharge (unbroken line) and after incomplete discharge (broken line).

FIG. 6 represents the variations versus time of the voltage Ucell at the terminals of a lead-acid battery cell during partial charging, respectively after full discharge (unbroken line) and after incomplete discharge (broken line). It can be seen from this figure that the coup de fouet effect on charging occurs if and only if the battery is previously sufficiently discharged.

Figure 7:
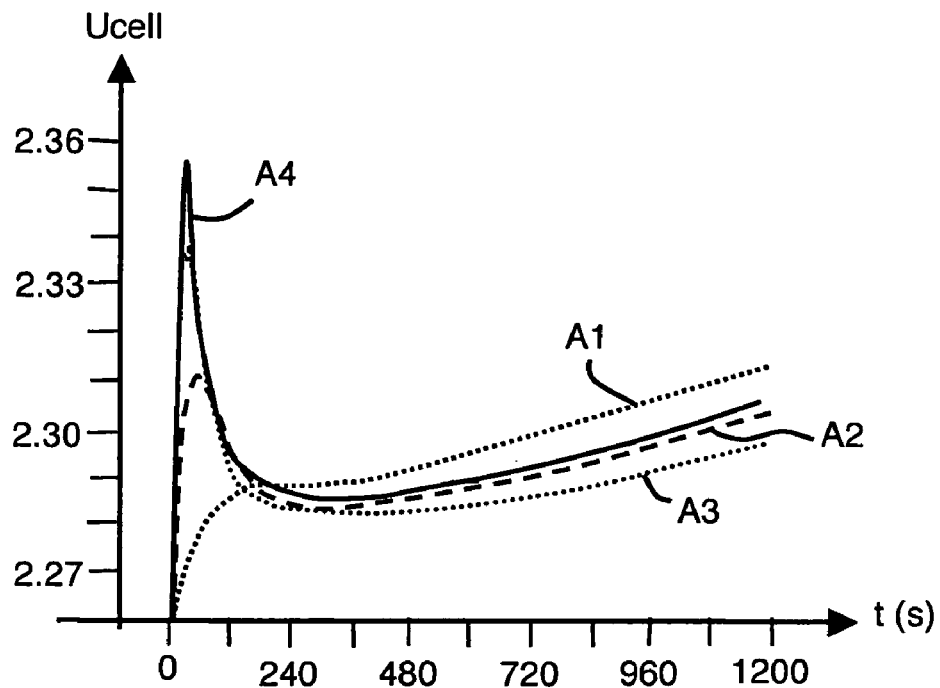
FIG. 7 represents the variations of the electrical parameters of a coup de fouet effect on charging when partial charging is performed under similar conditions at 0.1 $C_{10}$, following discharging interrupted respectively at voltage thresholds of 1.95 V (plot A1), 1.90 V (plot A2), 1.80 V (plot A3), and 1.70 V (plot A4).

FIG. 7 represents the variation of the electrical parameters of a coup de fouet effect on charging for a lead-acid battery cell when partial charging operations are performed under similar conditions following discharging interrupted respectively at voltage thresholds of 1.95 V (plot A1), 1.90 V (plot A2), 1.80 V (plot A3), and 1.70 V (plot A4). These curve plots illustrate the link existing between the parameters representative of a coup de fouet effect on charging and the conditions of the previous discharging, more particularly according to the end of discharge voltage threshold, in other words the depth of discharge reached. In particular, the lower the voltage threshold at the end of discharge, i.e. the greater the depth of discharge, the greater the amplitude of the coup de fouet effect on charging (Upeak and/or $\Delta U$).

Figure 8:
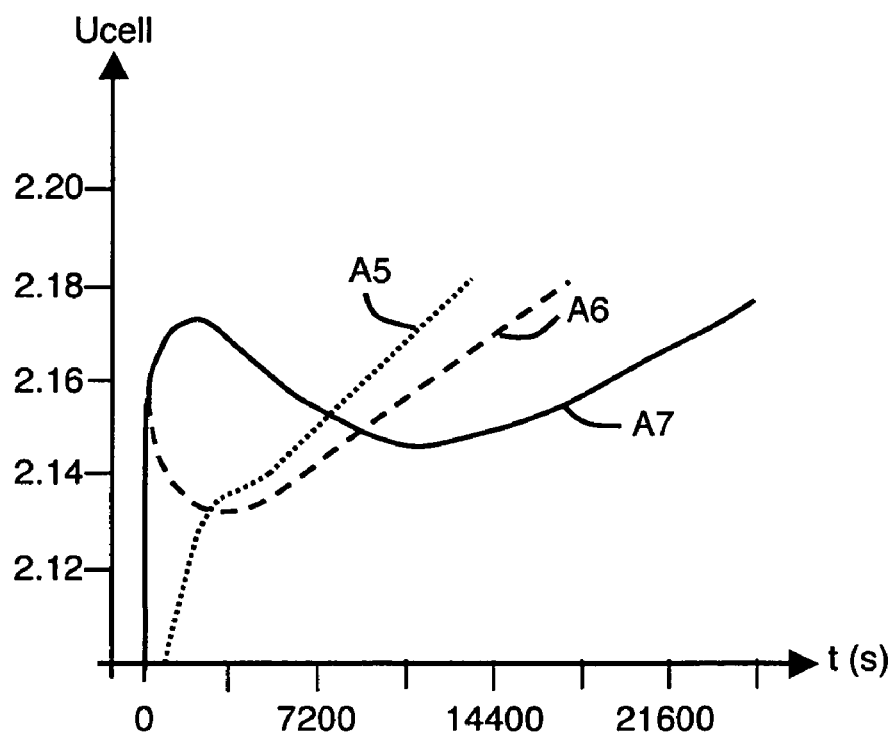
FIG. 8 represents the variations of the electrical parameters of a coup de fouet effect on charging when partial charging is performed under similar conditions at 0.1 $C_{10}$, following discharging interrupted at the same voltage threshold of 1.75 V and respectively performed under $0.2C_{10}$ (plot A5), $0.1C_{10}$ (plot A6), and $0.01C_{10}$ (plot A7) current conditions.

FIG. 8 represents the variations of the electrical parameters of a coup de fouet effect on charging for a lead-acid battery cell when partial charging operations are performed under similar conditions following discharging interrupted at the same voltage threshold of 1.75 V and respectively performed at $0.2C_{10}$ (plot A5), $0.1C_{10}$ (plot A6), and $0.01C_{10}$ (plot A7) current regimes. These plots illustrate the link existing between the parameters representative of a coup de fouet effect on charging and the conditions of the previous discharging, more particularly versus the current regime of the previous discharging, in other words versus the state of the active material of the discharged batteries or the depth of discharge reached. In particular, the lower the previous discharging, i.e. the greater the use of the active material and the depth of discharge, the greater the amplitude of the coup de fouet effect on charging.

Figure 9:
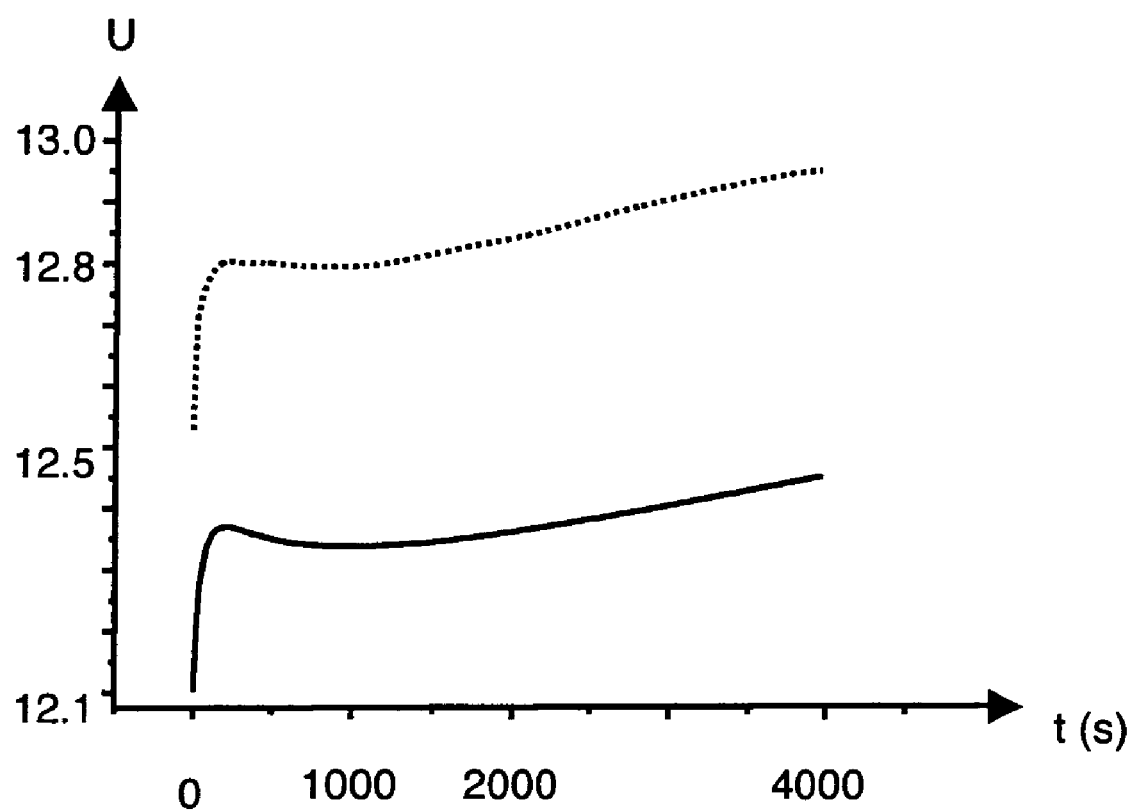
FIG. 9 represents the variations of the electrical parameters of a coup de fouet effect on charging in the case of a non-degraded discharged battery (unbroken line) and in the case of the same battery discharged and degraded (broken line).

FIG. 9 represents the variations of the electrical parameters of a coup de fouet effect on charging in the case of a non-degraded discharged battery (unbroken line) and in the case of the same battery discharged and degraded (broken line). Thus, in the case of a particularly degraded battery, the end of discharge voltage threshold is reached after a small quantity of electricity has been discharged, whatever the discharge current regime used. As illustrated by the broken line plot of FIG. 9, the coup de fouet effect on charging in this case becomes particularly weak or is not observed at all.

After simultaneous charging of previously discharged batteries, analysis of the electrical parameters representative of a coup de fouet effect on charging thereby in particular enables the presence or absence of this coup de fouet effect at the beginning of charging to be detected (FIGS. 5 and 6), and enables the batteries presenting a coup de fouet effect to be classified according to the depth of their discharge (FIGS. 7 and 8) and the degraded batteries to be distinguished from the non-degraded batteries (FIG. 9), i.e. enables the batteries to be differentiated according to their state of health.

Figure 4:
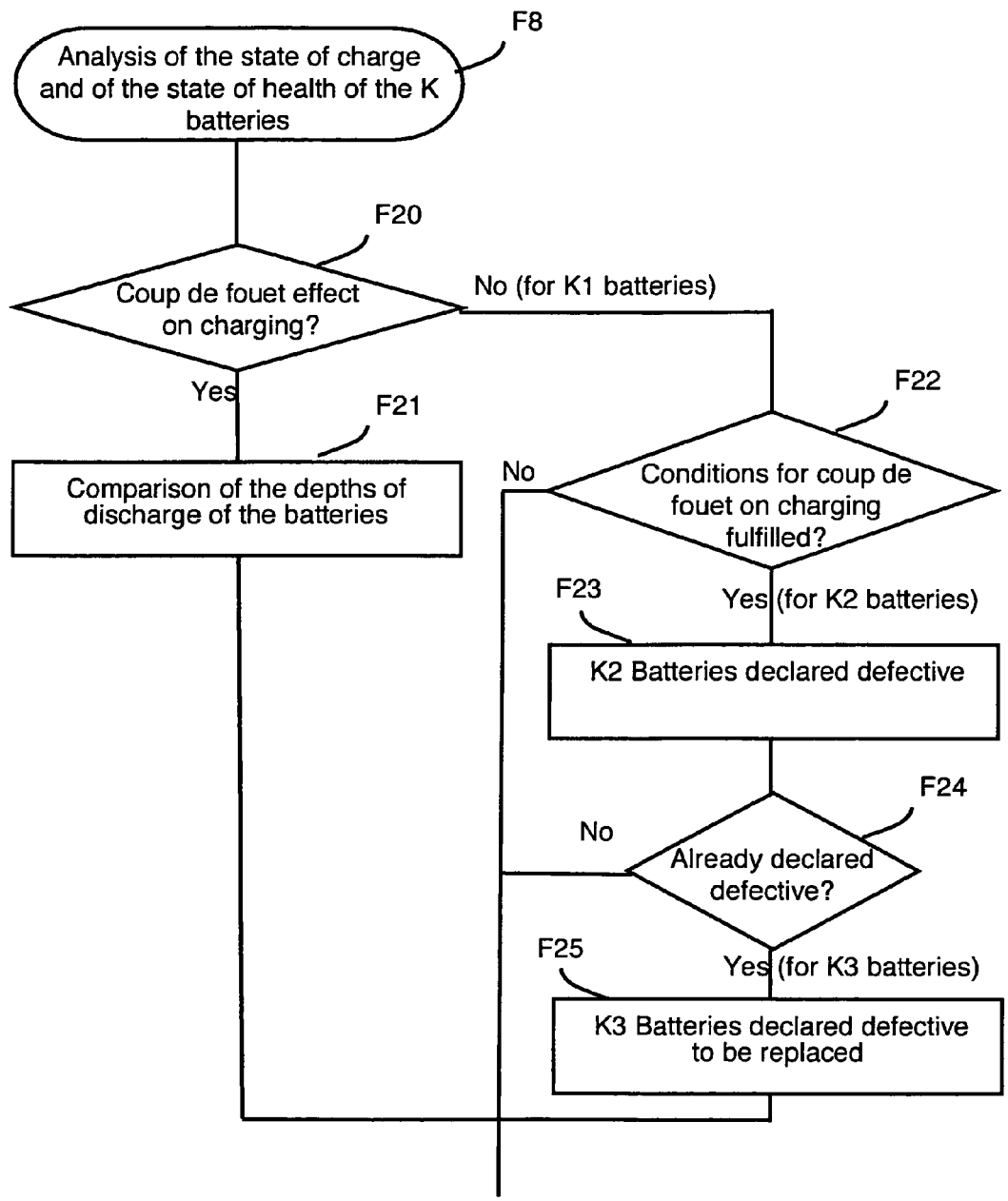

In the example illustrated in FIG. 4, to analyze the state of charge and of health of the K batteries (F8), the control circuit first checks (step F20) for each of the K recharged batteries whether a coup de fouet effect on charging was observed at the beginning of charging. Then, for the batteries for which a coup de fouet effect on charging was observed (Yes output of F20), the control circuit compares (F21) their depths of discharge. In practice, comparison of the depths of discharge is performed by a comparison of the amplitudes of the coup de fouet effects on charging, the parameters of which were measured during step (F7) for the different partially charged batteries. As indicated above with reference to FIGS. 7 and 8, the greater the amplitude of the coup de fouet effect, the deeper the battery is discharged. This subsequently enables the control circuit to give priority to charging the most discharged batteries when the order of priority is updated (F9, FIG. 2). The batteries are then charged sequentially according to an order of priority that depends on the depth of discharge of the different batteries.

In the example illustrated in FIG. 4, the coup de fouet effect on charging has not been observed (No output of F20) for a number K1 of analyzed batteries (K1≦K). In a step F22, the control circuit checks, for these K1 batteries, whether the conditions necessary for observation of a coup de fouet effect on charging are fulfilled. If this is not the case (No output of F22), analysis of the state of charge and of health of the batteries concerned is not continued. If on the other hand the observation conditions are found to be satisfied (Yes output of F22), which is the case for K2 batteries (K2≦K1) in the example of FIG. 4, the batteries concerned are declared defective (F23).

As illustrated in FIG. 2, when a battery has been declared defective during analysis of its state of health, the control circuit can trigger maintenance and/or replacement actions of these defective batteries (F10). In the example illustrated in FIG. 4, the control circuit distinguishes the defective batteries able to continue to be used after maintenance action from those that have to be replaced. The control circuit thus checks, in a step F24, whether a battery declared defective in the previous step (F23) has already been declared defective beforehand. If this is not the case (No output of F24), the control circuit considers that a maintenance or rehabilitation action can be undertaken.

Such a maintenance action can consist in having recourse to a boost charge, which generally involves increasing the high voltage threshold, to pulsed current charging or to notifying the user that he should perform maintenance of the battery himself, which may for example involve checking the electrolyte level and/or making additional electrical measurements.

If the defective battery diagnosis is repeated (Yes output of F24), which is the case of K3 batteries (K3≦K2) in the example of FIG. 4, the K3 batteries concerned are then considered to have to be replaced.

The management method described above thereby enables intelligent management of a bank of batteries or of a set of electrochemical cells, ensuring homogeneous use and aging of the different batteries of the bank and optimization of their service lifetime. This management method takes account of the state of charge of the batteries to preferentially charge the most discharged batteries, and takes account of the state of health of the batteries to trigger maintenance actions of the most degraded batteries and/or to recommend that the latter be replaced. The dependability and performances of the battery bank can thereby be optimized.

The priority criteria are preferably based on diagnosis of the state of charge of the batteries, and more particularly on diagnosis of the state of the active material of the discharged batteries, which enables priority to be given to charging the battery that is the most discharged according to this diagnosis.

This management method differs from existing methods in particular by the nature of diagnosis of the state of the batteries, which is based on the electrical parameters of a coup de fouet effect on charging, in particular on comparison of the amplitudes of the coup de fouet effects on charging corresponding to the different batteries. This method in particular presents the advantage of taking the impact of the conditions of the previous charging and discharging cycles into account in diagnosing the established state of charge, of establishing this diagnosis not at the end of charging for subsequent rechargings but right at the beginning of recharging. The whole of the electrical history of the analyzed batteries can thereby be taken into consideration. Furthermore, establishing the diagnosis does not require discharging, and therefore a loss of power, and also enables a diagnosis of the state of health of the analyzed batteries to be established at the same time.

The management method described above, and in particular priority recharging of the most extensively discharged batteries, ensures the most homogeneous possible use of each of the batteries of a battery bank. This moreover enables any over-dimensioning of the battery bank to be avoided thereby reducing the cost with equivalent performances.

The term 'battery' used in the above description extends to both rechargeable batteries and electrochemical cells.

The management method described above applies to any type of battery. It is in particular well suited for management of a bank of lead-acid batteries the use of which is commonplace in applications for which power production is intermittent, so as to adapt the power production to the demand, for example in photovoltaic applications.

In a general manner, all types of charging or discharging can be used, taking account of the type of battery and/or of the type of application in which this battery is used. In known manner, the voltage at the terminals of the battery and/or the charging and discharging current are monitored and/or measured during charging and/or discharging. Likewise, all end of charge and end of discharge criteria can be used, based for example on voltage thresholds or on voltage and/or current time profiles.

The invention is not limited to the particular embodiments described above. In an alternative embodiment, step F3 can for example concern management of all the N batteries of the bank and not only management of the subset formed by the K discharged batteries. In this case, all the batteries undergo the step of partial charging and measurement of the electrical parameters representative of a coup de fouet on charging. It is then not indispensable to previously detect the fully discharged batteries during the sequential charging cycle. By analyzing the parameters representative of a coup de fouet on charging, step F3 in fact also determines whether a battery is discharged or not (using the distinction illustrated in FIG. 6) and enables the depth of its discharge to be determined.

Analysis of the extent of discharge of each of the batteries on the basis of the electrical parameters representative of a coup de fouet on charging measured during partial charging of the batteries can moreover be used to choose the charging strategies to be used in a subsequent sequential charging cycle of the batteries. In general manner, all types of charging strategies can be used. Standard charging strategies conventionally comprise successive phases during which charging is controlled in current or voltage. These phases are generally interrupted on cut-off criteria according to voltage thresholds or charge quantities. A new charging strategy, based on the depth of discharge, determined on the basis of the electrical parameters representative of a coup de fouet effect on charging observed at the beginning of charging of a battery, can for example consist for this battery in adding an overcharging phase following a standard charging procedure, in applying a boost charge or a pulsed current.

The invention claimed is:

1. A method for managing a bank of rechargeable batteries comprising a sequential charging of the batteries of the bank according to an order of priority and analysis of a state of charge of the batteries, the method comprising:
   partial charging of at least one battery subset;
   measuring during said partial charging of electrical parameters representative of a coup de fouet effect on charging; and
   comparing amplitudes of the coup de fouet effect on charging associated with different batteries of the subset, the batteries of the bank being charged during a subsequent sequential charging cycle of the batteries of the bank according to an order of priority modified according to said comparison.

2. The method according to claim 1, wherein, in the subsequent sequential charging cycle, priority is given to charging the batteries that are most extensively discharged.

3. The method according to claim 1, wherein partial charging is performed simultaneously for all the batteries of the subset.

4. The method according to claim 1, comprising sequential charging of the batteries of the bank according to a preset order of priority, before said partial charging, a subsequent sequential charging step taking the modified order of priority into account.

5. The method according to claim 1, further comprising detecting fully discharged batteries, before said partial charging, said fully discharged batteries then constituting the at least one battery subset to be partially charged.

6. The method according to claim 1, further comprising analyzing a state of health of the batteries according to the electrical parameters representative of a coup de fouet effect on charging measured during said partial charging and triggering of maintenance actions according to said state of health.

7. The method according to claim 6, wherein said analyzing the state of health comprises detecting defective batteries.

8. The method according to claim 7, wherein detecting the defective batteries is based on an absence of coup de fouet effect on charging during said partial charging.

9. The method according to claim 1, wherein a charging strategy used during a subsequent sequential charging cycle of the batteries of the bank is adapted, for each battery, according to the electrical parameters representative of a coup de fouet effect previously measured for said battery.

\* \* \* \* \*